US008526708B2

(12) United States Patent
Anilturk

(10) Patent No.: US 8,526,708 B2
(45) Date of Patent: Sep. 3, 2013

(54) MEASUREMENT OF CRITICAL DIMENSIONS OF SEMICONDUCTOR WAFERS

(75) Inventor: Onder Anilturk, St. Nazaire les Eymes (FR)

(73) Assignee: Freescale Semiconductor, Inc., Austin, TX (US)

( * ) Notice: Subject to any disclaimer, the term of this patent is extended or adjusted under 35 U.S.C. 154(b) by 798 days.

(21) Appl. No.: 12/526,445

(22) PCT Filed: Aug. 2, 2007

(86) PCT No.: PCT/IB2007/051451
§ 371 (c)(1),
(2), (4) Date: Aug. 7, 2009

(87) PCT Pub. No.: WO2008/096211
PCT Pub. Date: Aug. 14, 2008

(65) Prior Publication Data
US 2010/0046828 A1    Feb. 25, 2010

(51) Int. Cl.
*G06K 9/00* (2006.01)
*G01B 5/28* (2006.01)

(52) U.S. Cl.
USPC ............................................ 382/145; 702/35

(58) Field of Classification Search
None
See application file for complete search history.

(56) References Cited

U.S. PATENT DOCUMENTS

| | | |
|---|---|---|
| 6,175,417 B1 | 1/2001 | Do et al. |
| 6,452,677 B1 | 9/2002 | Do et al. |
| 6,456,736 B1 | 9/2002 | Su et al. |
| 6,526,164 B1 | 2/2003 | Mansfield et al. |
| 6,539,106 B1 | 3/2003 | Gallarda et al. |
| 6,673,637 B2 | 1/2004 | Wack et al. |
| 6,754,593 B1 * | 6/2004 | Stewart et al. .................. 702/35 |
| 6,808,946 B1 | 10/2004 | Stirton et al. |
| 2002/0180986 A1 * | 12/2002 | Nikoonahad et al. ......... 356/600 |
| 2004/0115843 A1 * | 6/2004 | Wack et al. ..................... 438/14 |
| 2004/0235205 A1 * | 11/2004 | Levy et al. ...................... 438/14 |
| 2005/0127292 A1 * | 6/2005 | Kang et al. .................... 250/310 |
| 2005/0211897 A1 * | 9/2005 | Sasajima et al. .............. 250/307 |
| 2005/0254063 A1 * | 11/2005 | Hill ................................ 356/512 |
| 2007/0211932 A1 * | 9/2007 | Lee et al. ...................... 382/145 |

FOREIGN PATENT DOCUMENTS

| | | |
|---|---|---|
| WO | 2005108914 | 11/2005 |
| WO | WO2005108914 | * 11/2005 |

OTHER PUBLICATIONS

International Search Report and Written Opinion correlating to PCT/IB2007/051451 dated Dec. 22, 2008.

* cited by examiner

*Primary Examiner* — Ryan Zeender
*Assistant Examiner* — Denisse Ortiz Roman

(57) ABSTRACT

A semiconductor wafer critical dimension measurement method comprising receiving an image of a site of the semiconductor wafer comprising a plurality of features, processing the image to measure at least one critical dimension of at least some of the features, analyzing the critical dimension of each feature and determining the feature to be a non-defective feature or a defective feature, and using the critical dimension of at least some of any non-defective features as a measure of the critical dimension of features of the semiconductor wafer.

20 Claims, 2 Drawing Sheets

MEASUREMENT OF CRITICAL DIMENSIONS OF SEMICONDUCTOR WAFERS

FIELD OF THE INVENTION

This invention relates to the measurement of critical dimensions of semiconductor wafers.

BACKGROUND OF THE INVENTION

During the fabrication process for semiconductor wafers, it is common to place one or more test structures on the wafer. Subsequent to the provision of the test structures, one or more critical dimensions, such as width, of the structures are measured, generally using a scanning electron microscope (SEM). If the critical dimensions of the test structures are equal to, or lie within an acceptable range, of pre-defined values for the dimensions, the fabrication process is taken to be operating within acceptable parameters. If the critical dimensions of the test structures are not equal to, or do not lie within the acceptable range, of the pre-defined values, the fabrication process is taken to be operating outside the acceptable parameters, and the process may be stopped.

A number of potential problems exist with the measurement of such critical dimensions. For example, the measurements involve use of an SEM, which is an expensive measuring device. Further, critical dimensions of test structures are measured, not actual structures of the semiconductor wafers.

SUMMARY OF THE INVENTION

The present invention provides a semiconductor wafer critical dimension measurement method and system as described in the accompanying claims.

DETAILED DESCRIPTION OF PREFERRED EMBODIMENTS

Figure 1:
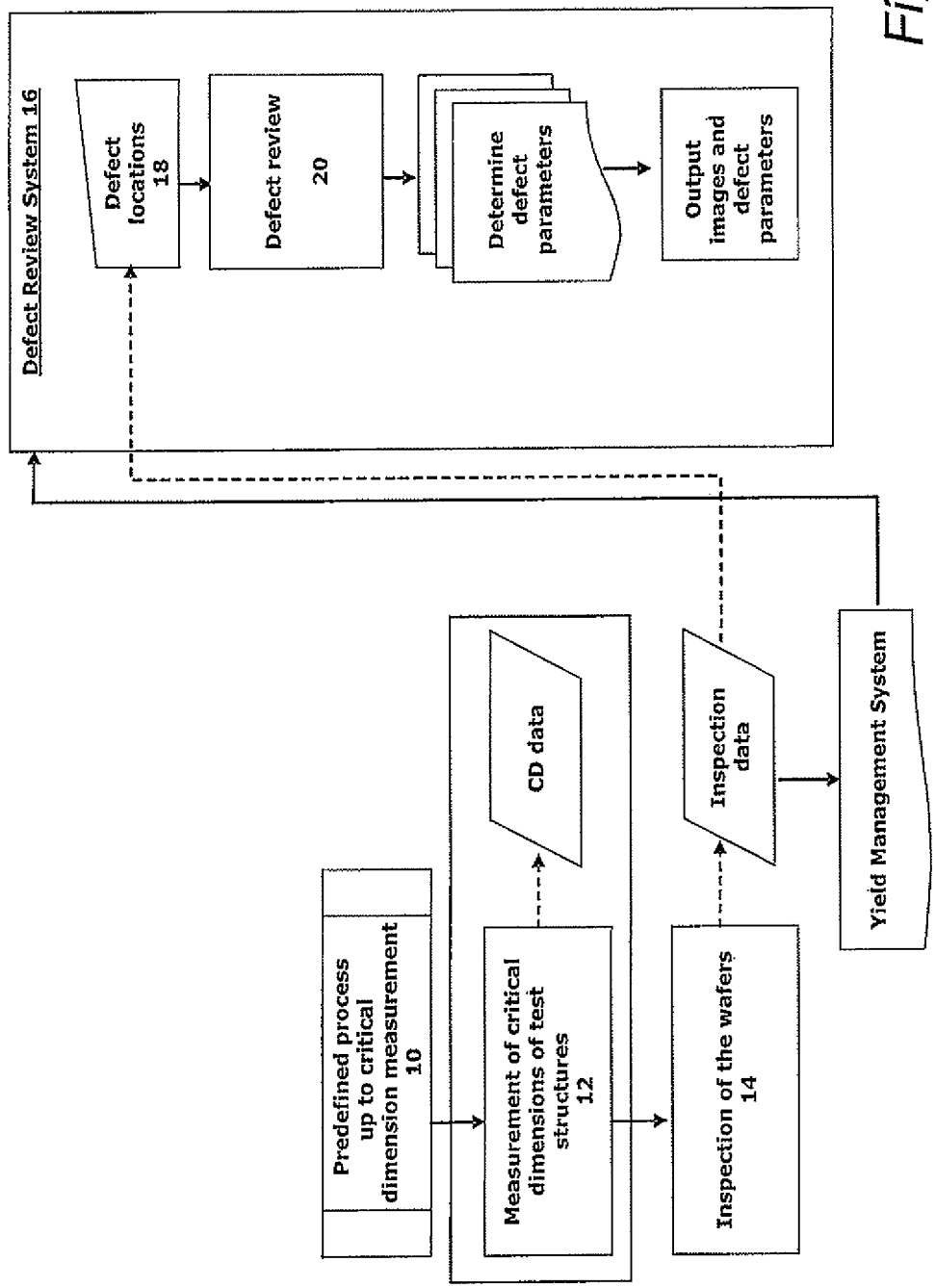
FIG. 1 is a flow diagram of a conventional prior art semiconductor fabrication process, given by way of example.

FIG. 1 illustrates some of the steps involved in a conventional semiconductor fabrication process. Step 10 is intended to represent a plurality of steps of the fabrication process. These steps include the formation of features of one or more structures of the semiconductor wafer being fabricated. The structures may be, for example, transistors, and the features may comprise, for example, source, drain and gate and electrical contacts of a transistor. These steps further include the formation of a plurality of test structures, for example 17 or more such structures, on the semiconductor wafer.

Step 12 represents measurement of one or more critical dimensions of the test structures. This step comprises using a scanning electron microscope (SEM) to measure at least one critical dimension, for example, the width, of each of the test structures. The critical dimension measurements are output, and examined to see if they are within a pre-defined range. If this is not the case, one or more parameters of the fabrication process may be altered, or the fabrication process may be stopped.

Step 14 represents conventional inspection of the semiconductor wafer being fabricated, for defects in the wafer. This step comprises using a number of investigation probes, for example electrons, lasers, and other illumination devices, to inspect the semiconductor wafer. The inspection is carried out at a number of sites of the wafer, and the site or sites which contain one or more possible defective features of the wafer (possible defect sites) are identified. The sites may correspond to different structures, e.g. transistors, of the wafer. The sites may be comprised in a layer of the wafer. Details of the possible defect sites are output to a yield management system and to a defect review system 16. Each of the investigation probes used has relatively low level resolution, in comparison to, for example an SEM. This provides a relatively inexpensive way to achieve a first pass analysis for defects in the wafer.

The defect review system 16 receives the details of the possible defect sites, and carries out further review of at least some of the possible defect sites. Step 18 of the review, comprises determining the location of the or each possible defective feature in each of the possible defect sites. Step 20 comprises reviewing at least some, and possibly all, of the possible defect sites. The possible defect sites which are reviewed may be chosen, for example, according to the location or brightness or darkness of one or more of the possible defect features located in the site. Reviewing the chosen possible defect sites comprises using a further scanning electron microscope to take a separate image of the wafer at each site. For each site, the image will comprise a picture of the or each possible defective feature of the wafer and also a picture of one or more possible non-defective features of the wafer. Such images are of the same or higher resolution than the techniques used in step 14, and one or more defect parameters of the one or more possible defective features in the sites, for example size, shape, topographic features, roundness, line edge roughness, volume, can be determined. The image and details of defect parameters thereof are output from the defect review system 16. The next possible defect site is then chosen and the above steps carried out for this site.

The above-described conventional critical dimension measurement steps and defect review steps take place as the fabrication of the wafer continues. If the measured critical dimensions lie outside a pre-defined acceptable range, or if the number or type of possible defective features found are not acceptable, the wafer may be scrapped, or some of the fabrication process parameters may be changed, or the fabrication process may be stopped.

Figure 2:
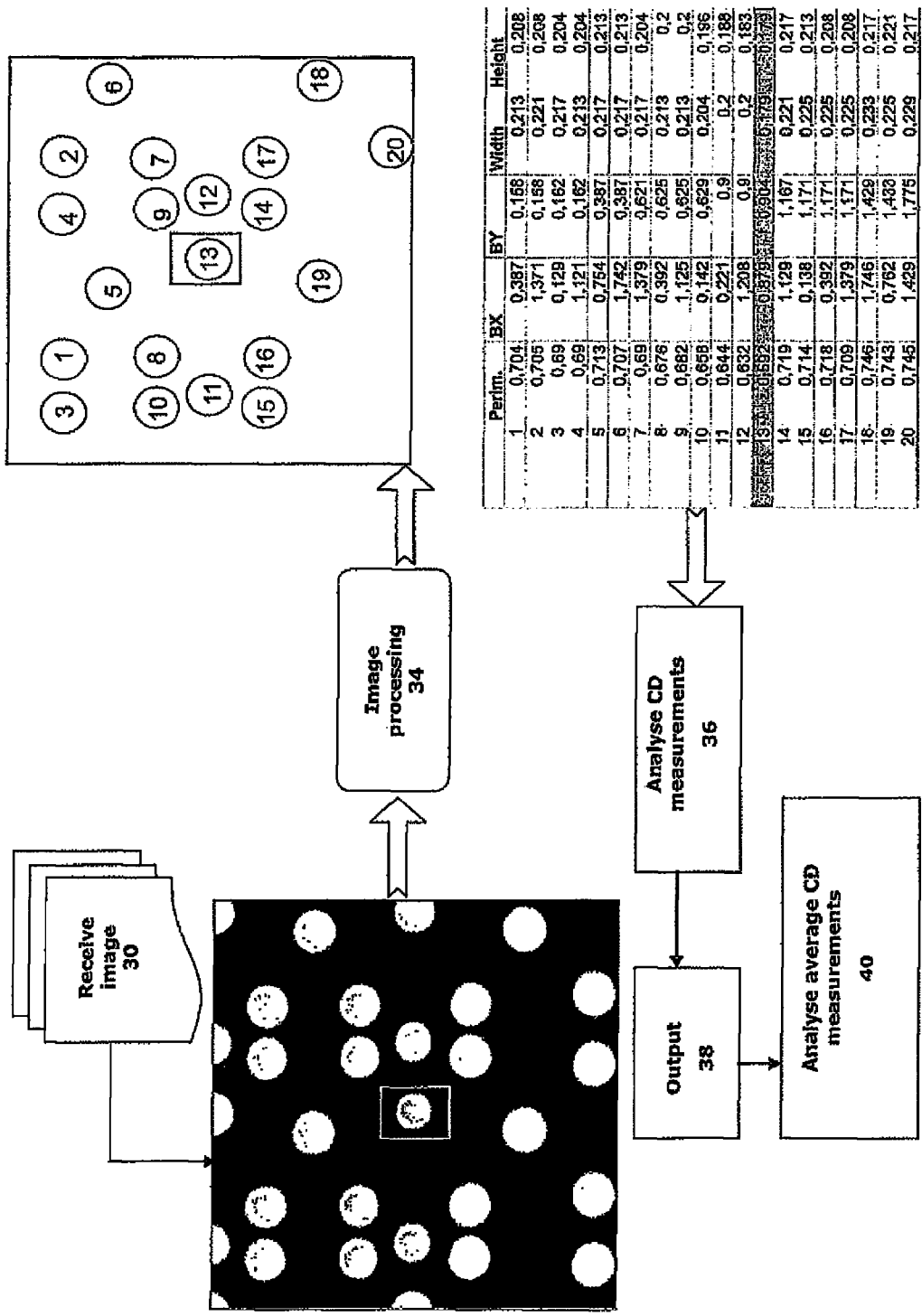
FIG. 2 is a flow diagram of the method in accordance with one embodiment of the invention, given by way of example.

FIG. 2 illustrates one embodiment of the method of the invention. Step 30 comprises receiving one or more images of one or more sites of a semiconductor wafer. The images may be of sites which have been reviewed by a defect review system (such as that described above). Alternatively, the images may be of sites which have been pre-chosen for critical dimension measurement, for example pre-chosen by an operator of a fabrication process of the semiconductor wafer. Each image comprises a plurality of features, for example contacts, of structures of the semiconductor wafer.

Step 34 comprises processing the or each image to measure a critical dimension of at least some of the features of the image. In this embodiment, this comprises drawing a contour around each feature which is completely contained in the image, determining the width of the contour around the feature, and using this as a measurement of the width critical dimension of the feature. It will be appreciated, however, that other characteristics of the contour around the feature may be determined, for example the height, and used as a measurement of a critical dimension of the feature.

Step 36 comprises analysing the measurements of the width critical dimensions of the features. For each feature, this may comprise comparing the width critical dimension of the feature with width critical dimensions of a plurality of other features, and determining the feature to be a non-defective feature if the width critical dimension of the feature is substantially equal to the width critical dimensions of a majority of the other features, and determining the feature to be a defective feature if the width critical dimension of the feature is not substantially equal to the width critical dimensions of the majority of the other features. The width critical dimension of a feature may be substantially equal to the width critical dimensions of the other features, if it lies within a pre-defined range of the width critical dimensions of the other features. Alternatively, analysing the measurements of the width critical dimensions of the features may comprise comparing the width critical dimension of the feature with a pre-defined width critical dimension range. The range may comprise a pre-defined acceptable standard deviation around an acceptable width critical dimension. If the width critical dimension of the feature lies within the pre-defined range, the feature is determined to be a non-defective feature. If the width critical dimension of the feature lies outside the pre-determined range, the feature is determined to be a defective feature. For the or each feature determined to be a non-defective feature, an average non-defective feature width critical dimension is calculated and stored.

Steps 34 and 36 are then repeated for each image, generating, for each site, a store of measurements of a width critical dimension of defective features of the site, measurements of a width critical dimension of non-defective features of the site, and an average non-defective feature width critical dimension of the site.

Step 38 comprises outputting, for each site, details of the width critical dimensions of the defective features and the non-defective features. The width critical dimensions of the non-defective features are used as a measure of the critical dimensions of features of the semiconductor wafer. Such a wafer critical dimension measure may then be used to control the fabrication process of the wafer. For example, the wafer critical dimension measure may be output to a controller of the fabrication process, for use, for example, for inline control of the fabrication process and in determining one or more faults in the process.

Step 40 comprises analysing the stored average non-defective feature width critical dimensions calculated for the sites, and determining a most-frequent average non-defective feature width critical dimension. This is then compared to a pre-defined range for the most-frequent average non-defective feature width critical dimension. If the most-frequent average non-defective feature width critical dimension lies outside the pre-defined range, this information is fed to a controller of the fabrication process, and the process is halted.

The method may be preceded by analysing at least one defect parameter generated for at least one defective feature of a site of the wafer by a defect review system, to determine whether or not the site should be selected for critical dimension measurement. For a defective feature comprising, for example, a contact, the analysis may comprise image processing procedures such as thresholding, smoothing, edge location, contrast enhancement, filtering.

This embodiment of the method of the invention may be implemented as part of the fabrication process of the wafer, specifically as part of the defect review of the process. A defect control system can use the SEM image generated at each site of the wafer for conventional defectivity data generation, and also for critical dimension measurement. This may require modification of application software of the defect review system. The defectivity data and/or the critical dimension data can be output to a controller of the fabrication process, and used for example for control, fault detection and halting of the process.

Alternatively, this embodiment of the method of the invention may be implemented independently from the fabrication process of the wafer. This would allow critical dimension measurement to be carried out, without intervention in the in-process defect review. The embodiment of the method may be implemented by software on a stand-alone computer dedicated for the analysis of received images. The images may be received to a receiver of the computer, and a processor and analyser of the computer used to carry out the steps of the embodiment of the method of the invention. When the images are generated by a defect review system, the images may also be used for defectivity data generation. As the process is not being disturbed by in-process critical dimension measurement, time may be spent in gaining statistical significant critical dimension measurements.

The steps of this embodiment of the method may be carried out for a relatively large number of sites of the wafer, sites which have been reviewed by a defect review system and/or pre-chosen sites. This increases the statistical significance of the critical dimension data which is produced, over that of critical dimension measurement in conventional wafer fabrication processes.

The method of the invention provides a number of advantages. Measurements of the critical dimensions may be generated using images generated by a defect review system of the fabrication process. This eradicates the need for a separate critical dimension measurement system, which saves the expense thereof. Further, this eradicates the separate critical dimension measurement steps in the fabrication process, making this process simpler and reducing the cost of the process. Critical dimension measurements are made of actual structural features of the wafer, rather than of test structures. This allows better control of the fabrication of the wafer. In conventional critical dimension measurement systems, measurements are made of only one feature, a test feature, at each site of the wafer. In the method of the invention, critical dimension measurements are made of a plurality of features at each site of the wafer. Therefore in the invention, more critical dimension measurements are made, allowing higher statistical significance to be achieved. Images taken by a defect review system, and used in the method of the invention, are often of higher quality than those taken by a critical dimension measurement system. This increases the accuracy of the critical dimension measurements of the invention.

It will be appreciated that the above advantages are given by way of example only, these and other advantages may be achieved by the invention, and not all of the advantages set forth are necessarily achieved by each embodiment of the invention.

The invention claimed is:

1. A semiconductor wafer critical dimension measurement method, comprising
   receiving an image of a site of the semiconductor wafer comprising a plurality of features,
   processing the image to measure at least one critical dimension of at least some of the features,
   analysing, by a processor, the critical dimension of each feature and determining the feature to be a non-defective feature or a defective feature, and
   using the critical dimensions of at least some of any non-defective features as a measure of the critical dimensions of features of the semiconductor wafer, using the measure of the critical dimensions of features of the semiconductor wafer to control fabricating the wafer, wherein analysing the critical dimension of a feature and determining the feature to be a non-defective feature or a defective feature, comprises comparing the critical dimension of the feature with the critical dimensions of a plurality of other features and determining the feature to be a non-defective feature if the critical dimension of the feature is substantially equal to the critical dimensions of a majority of the other features, and determining the feature to be a defective feature if the critical dimension of the feature is not substantially equal to the critical dimensions of a majority of the other features.

2. A method as claimed in claim 1, wherein the site is a site reviewed in a defect review in a fabrication process of the wafer, and the image of the site is produced in the defect review.

3. A method as claimed in claim 1, wherein the site is a site which has been pre-chosen for critical dimension measurement.

4. A method as claimed in claim 1, wherein processing the image to measure the critical dimension of at least some of the features comprises drawing a contour around each feature, determining the critical dimension of the contour, and using this as a measurement of the critical dimension of the feature.

5. A method as claimed in claim 1, wherein the image is processed to measure the critical dimension of at least some features which are completely contained in the image.

6. A method as claimed in claim 1, wherein analysing the critical dimension of a feature and determining the feature to be a non-defective feature or a defective feature, further comprises comparing the critical dimension of the feature with a pre-defined critical dimension range, and determining the feature to be a non-defective feature if the critical dimension of the feature lies within the pre-defined critical dimension range, and determining the feature to be a defective feature if the critical dimension of the feature lies outside the pre-defined critical dimension range.

7. A method as claimed in claim 1, wherein using the critical dimensions of at least some of any non-defective features as a measure of the critical dimensions of features of the semiconductor wafer, comprises calculating an average critical dimension of the non-defective features and using the average critical dimension as a measure of the critical dimensions of features of the semiconductor wafer.

8. A method as claimed in claim 7, comprising, for each of a plurality of sites of the wafer, calculating an average critical dimension of the non-defective features of the site, and using the average critical dimension of the sites as a measure of the critical dimensions of features of the semiconductor wafer.

9. A method as claimed in claim 7, wherein the at least one critical dimension which is measured comprises any of the width, height, shape, topographic features, line edge roughness, volume of a feature of the wafer.

10. A semiconductor wafer critical dimension measurement system, comprising
a receiver which receives an image of a site of the semiconductor wafer comprising a plurality of features,
a processor which processes the image to measure at least one critical dimension of at least some of the features,
an analyser which analyses the critical dimension of each feature, determines the feature to be a non-defective feature or a defective feature, and uses the critical dimension of at least some of any non-defective features as a measure of the critical dimension of features of the semiconductor wafer, wherein analysing the critical dimension of a feature and determining the feature to be a non-defective feature or a defective feature, comprises comparing the critical dimension of the feature with the critical dimensions of a plurality of other features and determining the feature to be a non-defective feature if the critical dimension of the feature is substantially equal to the critical dimensions of a majority of the other features, and determining the feature to be a defective feature if the critical dimension of the feature is not substantially equal to the critical dimensions of a majority of the other features.

11. A method as claimed in claim 2, wherein processing the image to measure the critical dimension of at least some of the features comprises drawing a contour around each feature, determining the critical dimension of the contour, and using this as a measurement of the critical dimension of the feature.

12. A method as claimed in claim 2, wherein the image is processed to measure the critical dimension of at least some features which are completely contained in the image.

13. A method as claimed in claim 4, wherein the image is processed to measure the critical dimension of at least some features which are completely contained in the image.

14. A method as claimed in claim 4, wherein analysing the critical dimension of a feature and determining the feature to be a non-defective feature or a defective feature, further comprises comparing the critical dimension of the feature with a pre-defined critical dimension range, and determining the feature to be a non-defective feature if the critical dimension of the feature lies within the pre-defined critical dimension range, and determining the feature to be a defective feature if the critical dimension of the feature lies outside the pre-defined critical dimension range.

15. A method as claimed in claim 4, wherein the at least one critical dimension which is measured comprises any of the width, height, shape, topographic features, line edge roughness, volume of a feature of the wafer.

16. A method as claimed in claim 5, wherein the at least one critical dimension which is measured comprises any of the width, height, shape, topographic features, line edge roughness, volume of a feature of the wafer.

17. A method as claimed in claim 5, wherein analysing the critical dimension of a feature and determining the feature to be a non-defective feature or a defective feature, further comprises comparing the critical dimension of the feature with a pre-defined critical dimension range, and determining the feature to be a non-defective feature if the critical dimension of the feature lies within the pre-defined critical dimension range, and determining the feature to be a defective feature if the critical dimension of the feature lies outside the pre-defined critical dimension range.

18. A method as claimed in claim 6, wherein using the critical dimensions of at least some of any non-defective features as a measure of the critical dimensions of features of the semiconductor wafer, comprises calculating an average critical dimension of the non-defective features and using the average critical dimension as a measure of the critical dimensions of features of the semiconductor wafer.

19. A method as claimed in claim 1, wherein using the measure of the critical dimensions of the features of the semiconductor wafer to control fabricating the wafer includes scrapping a wafer, stopping the fabrication process, or processing a wafer using a changed fabrication process parameter.

20. A method as claimed in claim 19, wherein using the measure of the critical dimensions of the features of the semiconductor wafer to control fabricating the wafer includes processing a wafer using a changed fabrication process parameter.

* * * * *

UNITED STATES PATENT AND TRADEMARK OFFICE
CERTIFICATE OF CORRECTION

PATENT NO. : 8,526,708 B2  Page 1 of 1
APPLICATION NO. : 12/526445
DATED : September 3, 2013
INVENTOR(S) : Anilturk It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 932 days.

Signed and Sealed this
Third Day of March, 2015

Michelle K. Lee
*Deputy Director of the United States Patent and Trademark Office*